United States Patent
Kuratani

(10) Patent No.: US 10,393,834 B2
(45) Date of Patent: Aug. 27, 2019

(54) MAGNETIC RESONANCE IMAGING APPARATUS AND NOISE REDUCTION METHOD

(71) Applicant: HITACHI, LTD., Tokyo (JP)

(72) Inventor: Atsushi Kuratani, Tokyo (JP)

(73) Assignee: HITACHI, LTD., Tokyo (JP)

(*) Notice: Subject to any disclaimer, the term of this patent is extended or adjusted under 35 U.S.C. 154(b) by 545 days.

(21) Appl. No.: 15/104,751

(22) PCT Filed: Jan. 15, 2015

(86) PCT No.: PCT/JP2015/050902
§ 371 (c)(1),
(2) Date: Jun. 15, 2016

(87) PCT Pub. No.: WO2015/111493
PCT Pub. Date: Jul. 30, 2015

(65) Prior Publication Data
US 2017/0003362 A1     Jan. 5, 2017

(30) Foreign Application Priority Data
Jan. 27, 2014   (JP) ................................ 2014-012796

(51) Int. Cl.
     *G01R 33/385*     (2006.01)
     *G01R 33/54*      (2006.01)
     *G01R 33/561*     (2006.01)

(52) U.S. Cl.
     CPC ....... *G01R 33/3854* (2013.01); *G01R 33/546* (2013.01); *G01R 33/5614* (2013.01); *G01R 33/5616* (2013.01)

(58) Field of Classification Search
     CPC ............................................. G01R 33/20–586
     See application file for complete search history.

(56) References Cited

U.S. PATENT DOCUMENTS 5,162,730 A * 11/1992 Schmitt .............. G01R 33/5615
                                                       324/307
5,319,309 A * 6/1994 den Boef ........... G01R 33/3415
                                                       324/307

(Continued)

FOREIGN PATENT DOCUMENTS

JP          4360912       8/2009
JP     2011-530371    12/2011

(Continued)

OTHER PUBLICATIONS

International Search Report in PCT/JP2015/050902.

*Primary Examiner* — Huy Q Phan
*Assistant Examiner* — David B Frederiksen
(74) *Attorney, Agent, or Firm* — Cooper & Dunham LLP

(57) ABSTRACT

To supply a magnetic resonance imaging (MRI) apparatus capable of shifting a high frequency of noise into a low frequency during measurement, the magnetic resonance imaging apparatus includes: a gradient magnetic field device (9, 10) that applies a pulse-shaped gradient magnetic field to an object placed in a static magnetic field; and a measurement control unit (4) that drives the gradient magnetic field device by a gradient magnetic field pulse and measures magnetic resonance image data. The measurement control unit performs noise suppression control to shift a frequency of noise generated by the gradient magnetic field device to a low frequency side by changing a waveform of the gradient magnetic field pulse during repetition of the gradient magnetic field pulses at a constant period.

9 Claims, 12 Drawing Sheets

(56) References Cited

U.S. PATENT DOCUMENTS

| | | | |
|---|---|---|---|
| 6,236,204 B1* | 5/2001 | Heid | G01R 33/3854 |
| | | | 324/307 |
| 2004/0245987 A1 | 12/2004 | Ham et al. | |
| 2005/0174114 A1* | 8/2005 | Mugler, III | G01R 33/5613 |
| | | | 324/309 |
| 2005/0270030 A1* | 12/2005 | Takai | G01R 33/3854 |
| | | | 324/318 |
| 2007/0252597 A1* | 11/2007 | Posse | G01R 33/485 |
| | | | 324/312 |
| 2011/0044524 A1* | 2/2011 | Wang | G01R 33/54 |
| | | | 382/131 |
| 2011/0142250 A1 | 6/2011 | Schmale et al. | |
| 2013/0076357 A1* | 3/2013 | Grodzki | A61B 5/062 |
| | | | 324/309 |
| 2013/0088225 A1* | 4/2013 | Weller | G01R 33/5611 |
| | | | 324/307 |
| 2013/0200893 A1* | 8/2013 | Heismann | G01R 33/3854 |
| | | | 324/314 |
| 2014/0111200 A1* | 4/2014 | Grodzki | G01R 33/543 |
| | | | 324/309 |
| 2014/0128722 A1* | 5/2014 | Schweitzer | A61B 5/7203 |
| | | | 600/411 |
| 2014/0232396 A1* | 8/2014 | Grodzki | G01R 33/543 |
| | | | 324/309 |
| 2014/0347048 A1 | 11/2014 | Sun et al. | |
| 2014/0347050 A1 | 11/2014 | Gui et al. | |
| 2014/0347052 A1* | 11/2014 | Kamata | G01R 33/56563 |
| | | | 324/309 |
| 2015/0008919 A1* | 1/2015 | Grodzki | G01R 33/543 |
| | | | 324/309 |
| 2015/0077109 A1* | 3/2015 | Grodzki | G01R 33/3854 |
| | | | 324/309 |
| 2015/0145514 A1* | 5/2015 | Sharma | G01R 33/243 |
| | | | 324/309 |
| 2015/0355305 A1* | 12/2015 | Helle | G01R 33/3854 |
| | | | 324/309 |

FOREIGN PATENT DOCUMENTS

| | | |
|---|---|---|
| WO | WO2013/165571 A1 | 11/2013 |
| WO | WO2014/189929 A1 | 11/2014 |

* cited by examiner

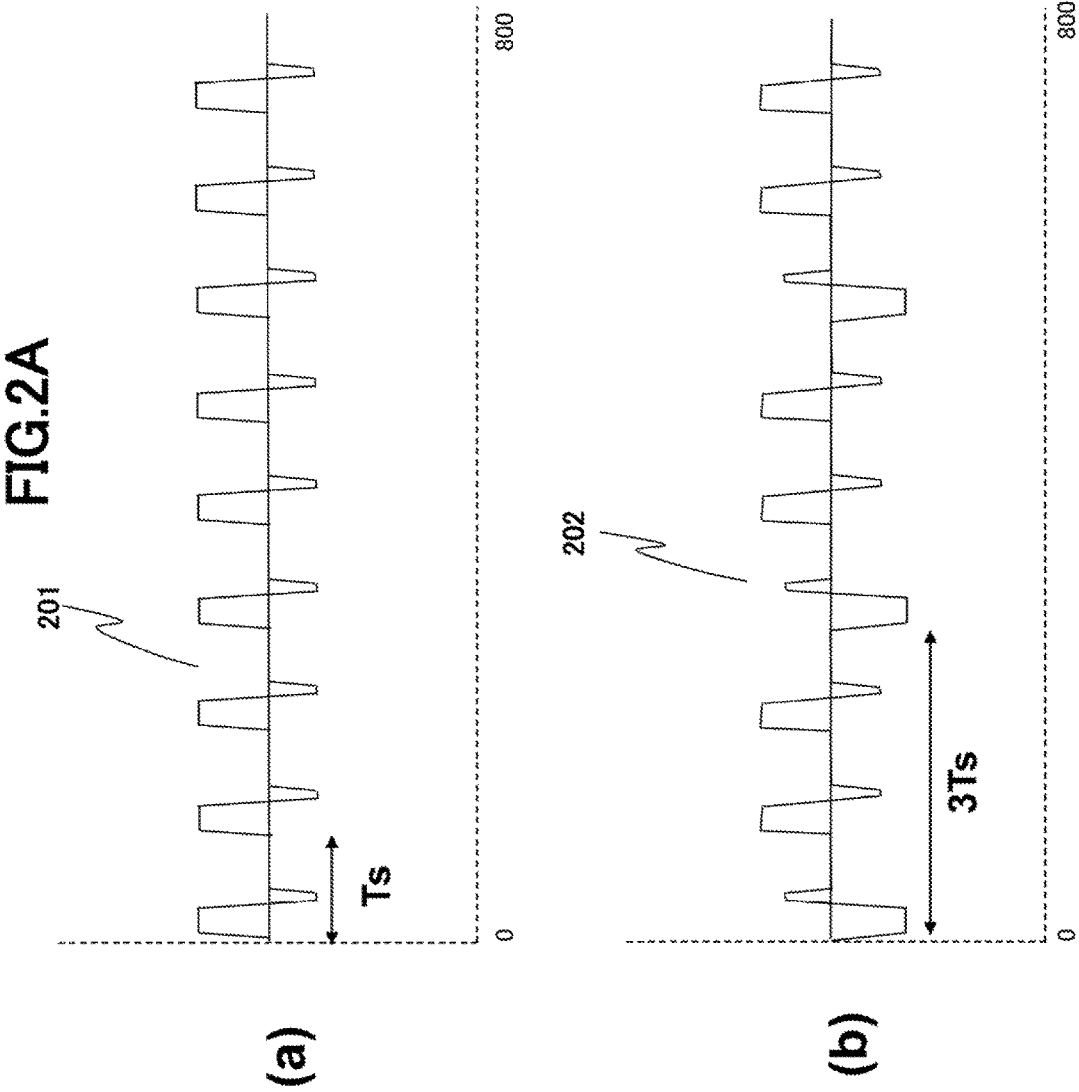

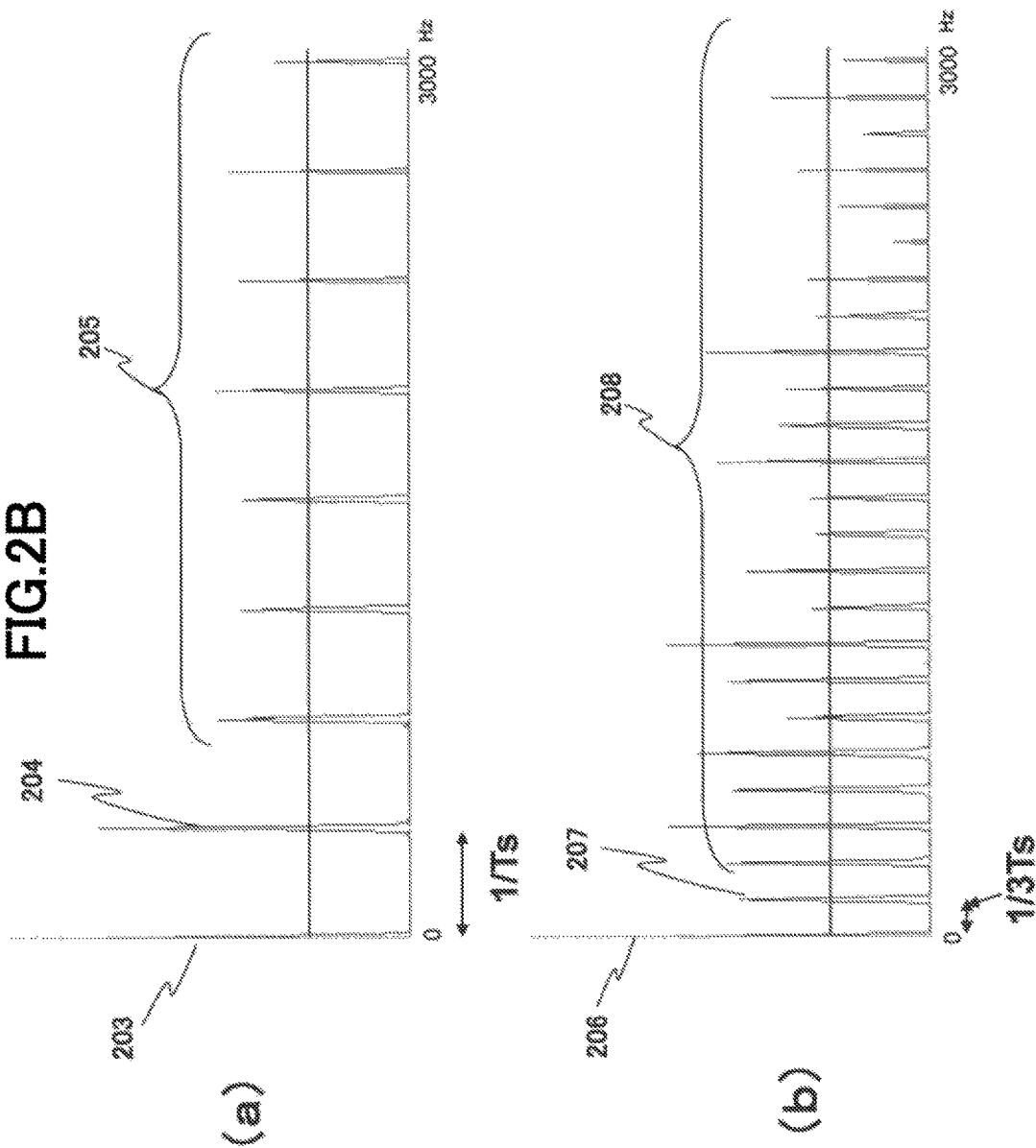

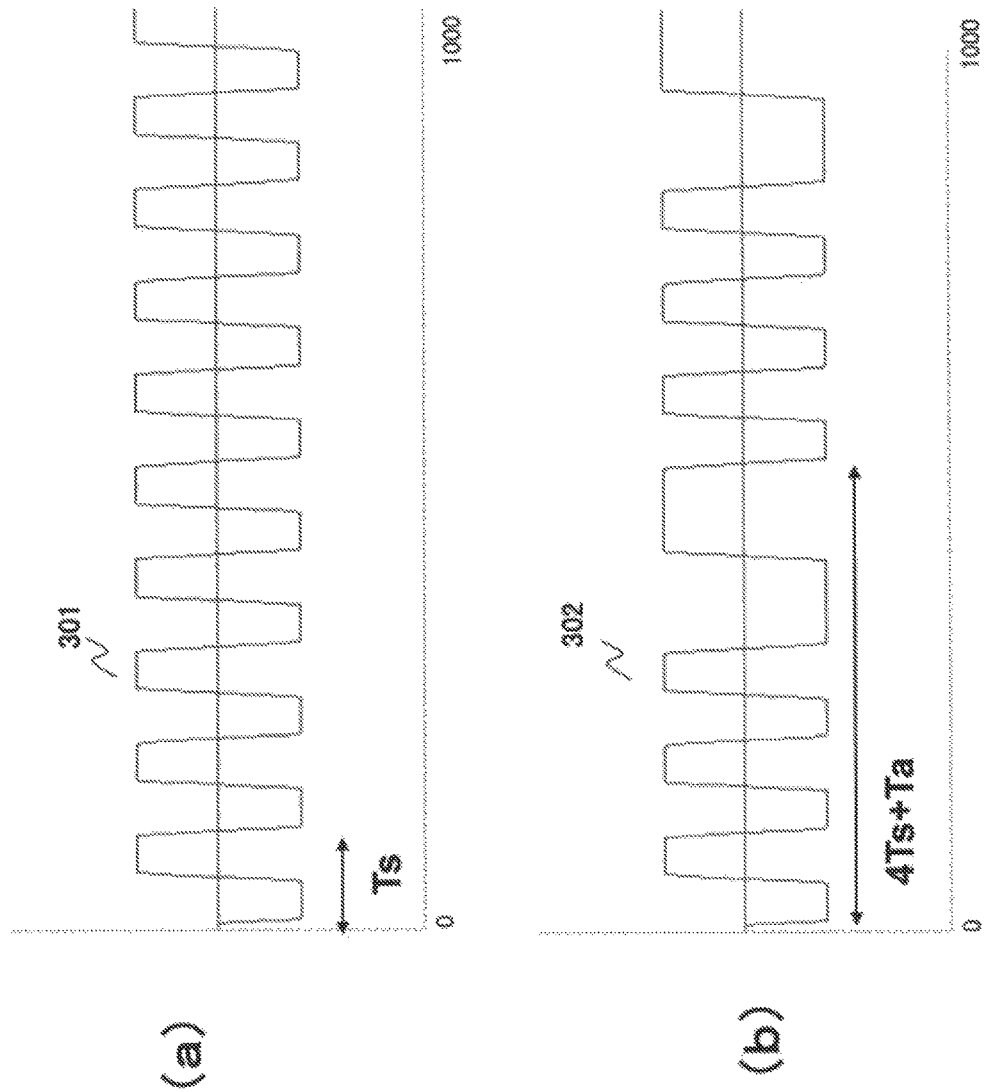

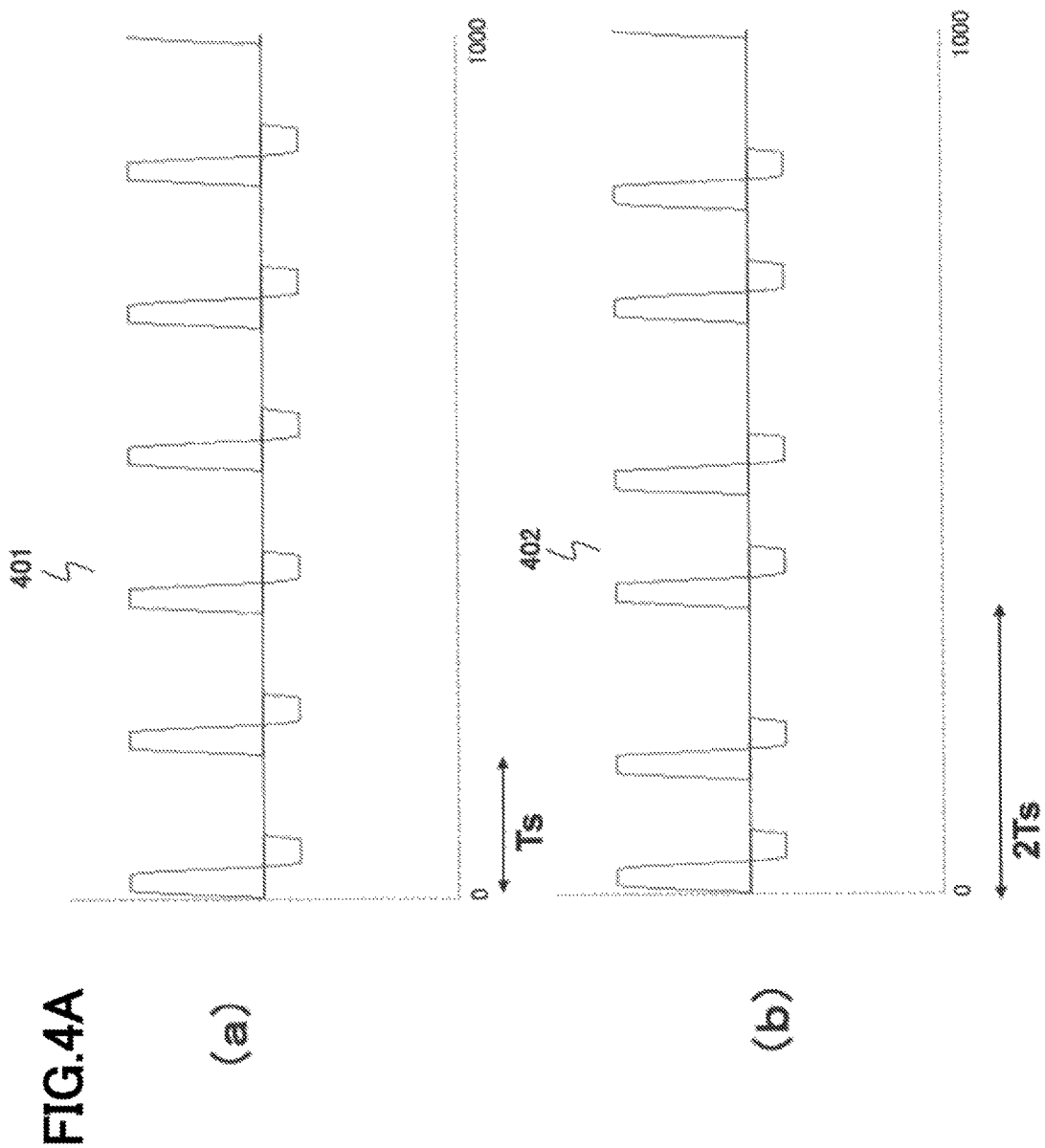

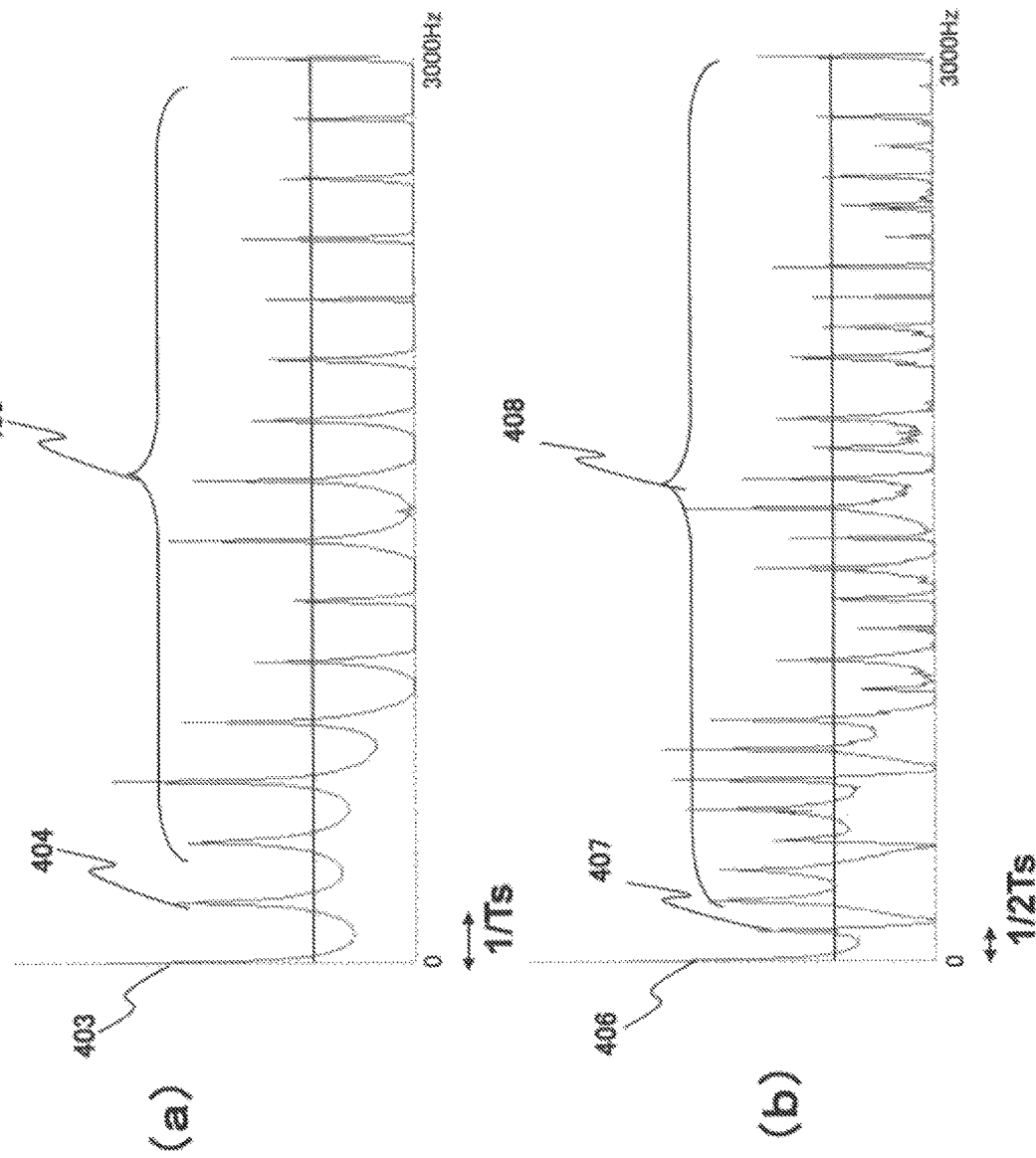

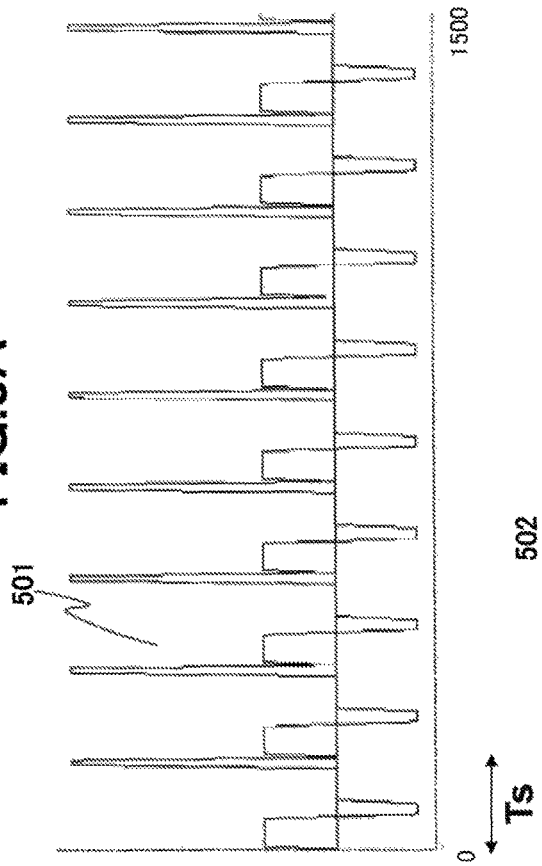

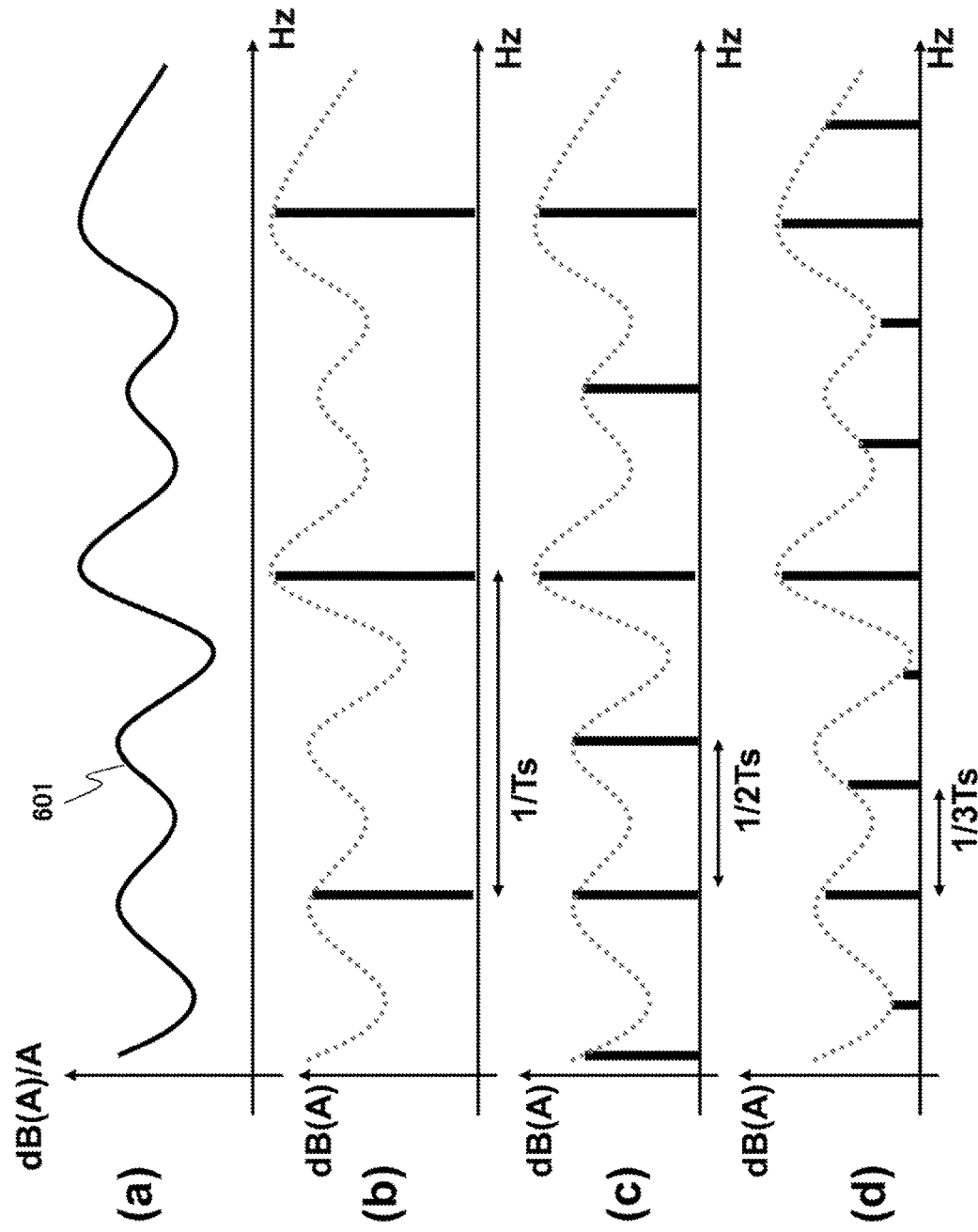

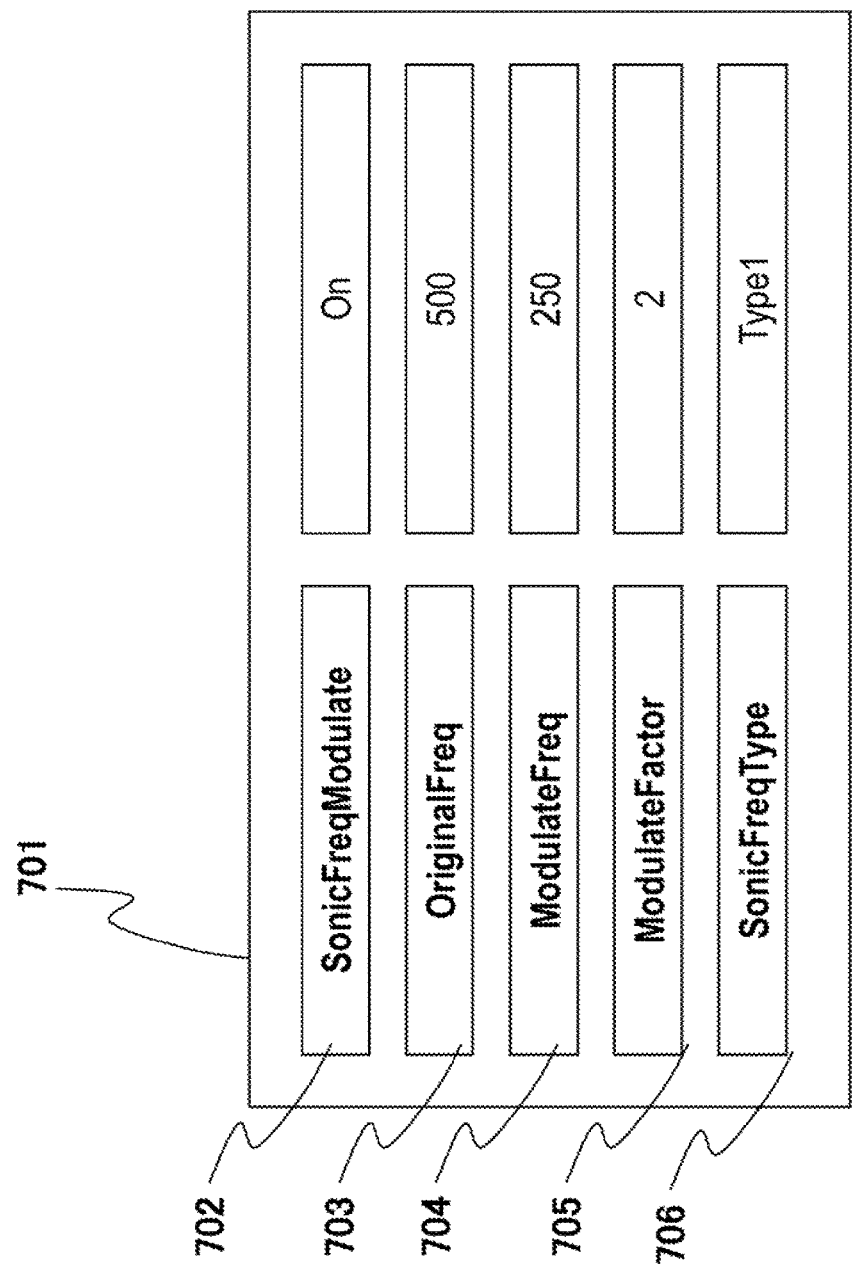

MAGNETIC RESONANCE IMAGING APPARATUS AND NOISE REDUCTION METHOD

TECHNICAL FIELD

The present invention relates to a magnetic resonance imaging apparatus, and more particularly, to a technology for alleviating noise occurring in a gradient magnetic field device that applies a gradient magnetic field with a pulse shape to an object placed in a static magnetic field.

BACKGROUND ART

Magnetic resonance imaging apparatuses (hereinafter referred to as MRI apparatuses) apply local gradient magnetic fields with pulse shapes to objects placed in static magnetic fields using gradient magnetic field devices including gradient magnetic field coils to acquire MR images. When gradient magnetic fields are generated, electromagnetic forces are generated in gradient magnetic field coils and the electromagnetic forces cause the gradient magnetic field devices including the gradient magnetic field coils to generate mechanical strain, and thus noise occur from the gradient magnetic field devices. In particular, in cases in which repetition times (periods) of currents of gradient magnetic field pulses circulated in the gradient magnetic field coils are considerably short, sounds with high frequencies are generated. Since the sounds impose mental strains on objects at the time of imaging, reduction in the noise is an important task in MRI apparatuses.

For example, PTL 1 provides countermeasures to the problem that noise occurs since an electromagnetic force is generated by driving a gradient magnetic field coil according to a pulse sequence and the gradient magnetic field coil generating mechanical strain (vibration).

CITATION LIST

Patent Literature

PTL 1: U.S. Pat. No. 6,567,685

SUMMARY OF INVENTION

Technical Problem

In PTL 1, however, a gradient magnetic field repeatedly rises and falls in a short time in a case in which a repetition interval (period) of a gradient magnetic field pulse is short. Therefore, noise with a high frequency occurs, and thus it was not sufficient to consider suppressing of the noise giving a severe discomfort to an object.

In view of the forgoing circumstances, an object of the present invention is to provide an MRI apparatus capable of allowing noise with a high frequency to have a low frequency during measurement.

Solution to Problem

To resolve the foregoing problem, a magnetic resonance imaging apparatus includes: a gradient magnetic field device that applies a pulse-shaped gradient magnetic field to an object placed in a static magnetic field; and a measurement control unit that drives the gradient magnetic field device by a gradient magnetic field pulse and measures magnetic resonance image data. The measurement control unit performs noise suppression control to shift a frequency of noise generated by the gradient magnetic field device to a low frequency side by changing a waveform of the gradient magnetic field pulse during repetition of the gradient magnetic field pulses at a constant period.

That is, the present invention is based on the discovery in which the period of an application interval (period) of a plurality of gradient magnetic field pulses linked with the gradient magnetic field pulse with the changed waveform is lengthened when the waveform of the gradient magnetic field pulse is changed during the repetition of the gradient magnetic field pulses at the constant period. In general, people feel uncomfortable as a frequency is higher. Therefore, by shifting the frequency of noise to a low frequency side, it is possible to reduce the sense of discomfort of people who are objects.

Advantageous Effects of Invention

According to the present invention, it is possible to shift the high frequency of noise to a low frequency during measurement.

BRIEF DESCRIPTION OF DRAWINGS

FIG. 2A is a diagram illustrating (a) a temporal change of a gradient magnetic field pulse in the related art and (b) a temporal change of a gradient magnetic field pulse according to Example 1.

FIG. 2B is a diagram illustrating (a) a frequency distribution obtained by performing Fourier conversion in the related art in (a) of FIG. 2A on the gradient magnetic field pulse and (b) a frequency distribution obtained by performing Fourier conversion according to Example 1 in (b) of FIG. 2A on the gradient magnetic field pulse.

FIG. 3A is a diagram illustrating (a) a temporal change of a gradient magnetic field pulse in the related art and (b) a temporal change of a gradient magnetic field pulse according to Example 2.

FIG. 4A is a diagram illustrating (a) a temporal change of a gradient magnetic field pulse in the related art and (b) a temporal change of a gradient magnetic field pulse according to Example 3.

FIG. 4B is a diagram illustrating (a) a frequency distribution illustrated the gradient magnetic field pulse subjected to Fourier conversion in the related art in (a) of FIG. 4A and (b) a frequency distribution illustrated the gradient magnetic field pulse subjected to Fourier conversion according to Example 3 in (b) of FIG. 4A.

FIG. 5A is a diagram illustrating (a) a temporal change of a gradient magnetic field pulse in the related art and (b) a temporal change of a gradient magnetic field pulse according to Example 4.

FIG. 6 is a diagram illustrating frequency characteristics of noise of a gradient magnetic field device and a relation between a noise level and a frequency when a period of a gradient magnetic field pulse is changed.

FIG. 7 is a diagram illustrating an example of an operation screen showing a noise-reduction parameter or the like in each example of noise suppression control of an MRI apparatus.

DESCRIPTION OF EMBODIMENTS

Hereinafter, the present invention will be described based on an embodiment and examples with reference to the appended drawings.

Figure 1:
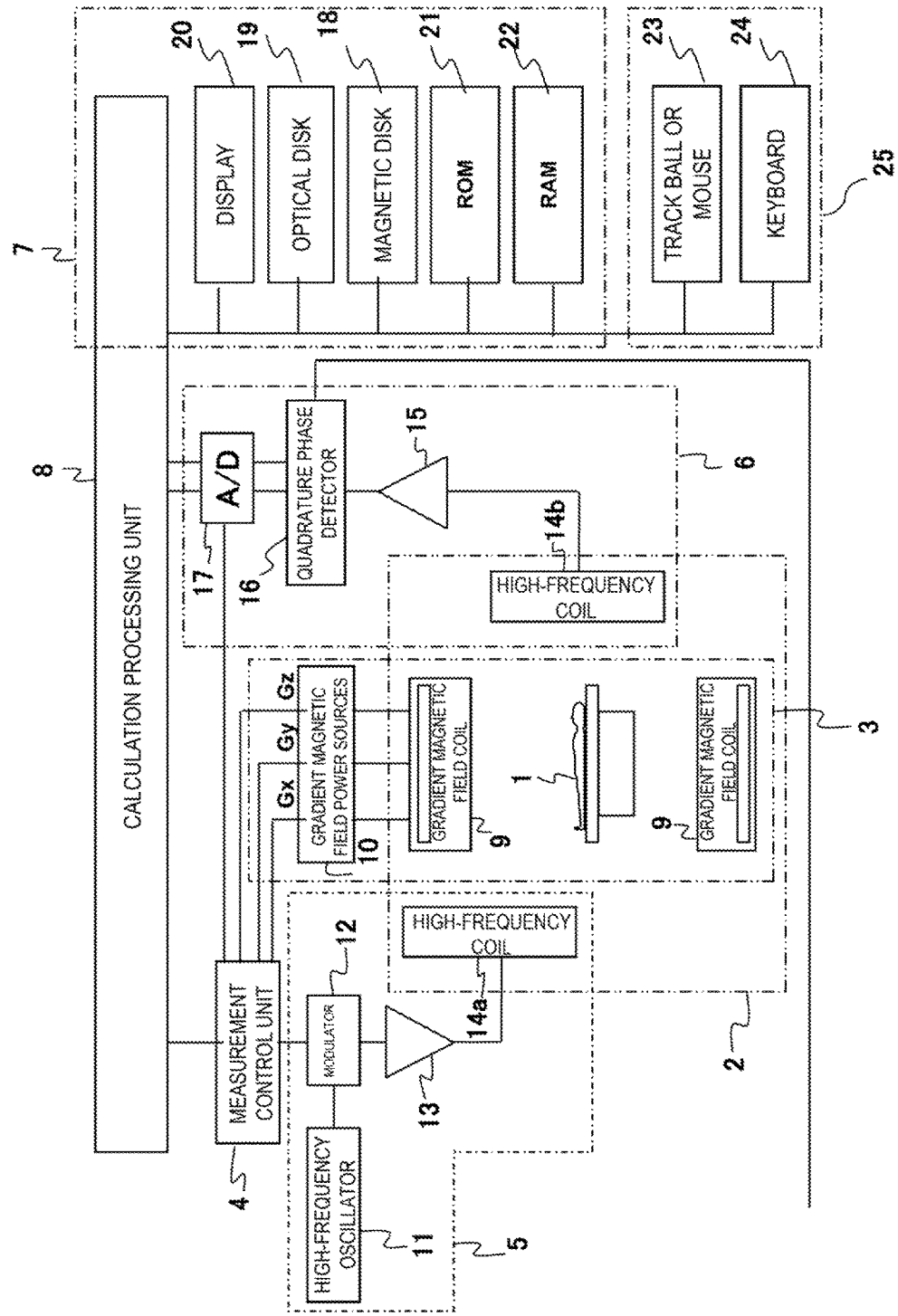
FIG. 1 is a block diagram illustrating the entire configuration of an MRI apparatus according to an embodiment of the present invention.

An embodiment of an MRI apparatus according to the present invention will be described with reference to FIG. 1. In all of the drawings for describing the embodiment of the present invention, the same reference numerals are given to elements having the same functions and the repeated description thereof will be omitted. As illustrated in FIG. 1, the MRI apparatus according to the embodiment images a tomographic image of an object using a nuclear magnetic resonance (NMR) phenomenon. As illustrated in FIG. 1, the MRI apparatus includes a static magnetic field generation system 2, a gradient magnetic field generation system 3, a transmission system 5, a reception system 6, a signal processing system 7, a measurement control unit 4, and a calculation processing unit (CPU) 8.

In a vertical magnetic field scheme, the static magnetic field generation system 2 generates a uniform static magnetic field in a direction orthogonal to the body axis of an object 1 in a space near the object 1. In a horizontal magnetic field scheme, a uniform static magnetic field is generated in a body axis direction. A static magnetic field generation source of a permanent magnet scheme, a normal conductive scheme, or a super-conductive scheme is disposed near the object 1.

The gradient magnetic field generation system 3 is formed by gradient magnetic field coils 9 which are wound in tri-axis directions of X, Y, and Z which are the coordinate system (static coordinate system) of the MRI apparatus and gradient magnetic field power sources 10 that drive each gradient magnetic field coil. A gradient magnetic field device is configured to include the gradient magnetic field coils 9 and the gradient magnetic field power sources 10. The gradient magnetic field power source 10 is installed to correspond to each gradient magnetic field coil 9 of each of X, Y, and Z axes. Each gradient magnetic field power source 10 is driven according to a gradient magnetic field pulse output from the measurement control unit 4 to be described below. Accordingly, gradient magnetic fields Gx, Gy, and Gz are applied in the tri-axis directions of X, Y, and Z. At the time of imaging, a slice selection gradient magnetic field pulse (Gs) is applied in a direction orthogonal to a slice surface (imaged cross-section) to set the slice surface in regard to the object 1, and a phase encoding gradient magnetic field pulse (Gp) and a frequency encoding gradient magnetic field pulse (Gf) are applied in the two remaining directions orthogonal to the slice surface and orthogonal to each other to encode position information in each direction in an echo signal.

The measurement control unit 4 is control means for repeatedly applying a high-frequency magnetic field pulse of an excitation frequency (hereinafter referred to as an "RF pulse") and a gradient magnetic field pulse in a set predetermined pulse sequence. The measurement control unit 4 operates under the control of the calculation processing unit 8 and transmits various commands necessary to collect data of tomographic images of the object 1 to the transmission system 5, the gradient magnetic field generation system 3, and the reception system 6.

The transmission system 5 radiates the RF pulse to the object 1 to generate nuclear magnetic resonance in nuclear spins of atoms that form biological tissues of the object 1, and is configured to include a high-frequency oscillator 11, a modulator 12, a high-frequency amplifier 13, and a transmission-side high-frequency coil (transmission coil) 14a.

The RF pulse is radiated to the object 1 by causing the modulator 12 to modulate the amplitude of a high-frequency pulse output from the high-frequency oscillator 11 at a timing indicated by an instruction from the measurement control unit 4, causing the high-frequency amplifier 13 to amplify the high-frequency pulse subjected to the amplitude modulation, and subsequently supplying the high-frequency pulse to the high-frequency coil (transmission coil) 14a disposed near the object 1.

The reception system 6 detects an echo signal (NMR signal) emitted through nuclear magnetic resonance of the nuclear spins that form the biological tissues of the object 1 and is formed by a reception-side high-frequency coil (reception coil) 14b, a signal amplifier 15, a quadrature phase detector 16, and an A/D converter 17. The NMR signal which is a response of the object 1 caused by electromagnetic waves radiated from the transmission-side high-frequency coil 14a is detected by the high-frequency coil 14b disposed near the object 1, is amplified by the signal amplifier 15, is subsequently divided into signals of two orthogonal systems by the quadrature phase detector 16 at a timing indicated by an instruction from the measurement control unit 4, each of them is converted into a digital amount by the A/D converter 17, and is transmitted to the signal processing system 7.

The signal processing system 7 displays and stores various data processes and processed results and is configured to include an optical disc 19, an external storage device such as a magnetic disk 18, and a display 20 such as a CRT. When data from the reception system 6 is input to the calculation processing unit 8, the calculation processing unit 8 performs processes such as signal processing and image restoration, displays tomographic images of the object 1 which are results of the processes on the display 20, and records the tomographic images in the magnetic disk 18 or the like of the external storage device.

An operation unit 25 inputs various kinds of control information regarding the MRI apparatus or control information regarding a process performed by the signal processing system 7 and is formed by a track ball or mouse 23 and a keyboard 24. The operation unit 25 is disposed near the display 20. An operator controls various processes of the MRI apparatus in an interactive manner through the operation unit 25 while viewing the display 20.

In FIG. 1, the transmission-side high-frequency coil 14a and the gradient magnetic field coils 9 are installed in a static magnetic field space of the static magnetic field generation system 2 into which the object 1 is inserted to face the object 1 in the case of the vertical magnetic field scheme or surround the object 1 in the case of the horizontal magnetic field scheme. The reception-side high-frequency coil 14*b* is installed to face or surround the object 1.

As an imaging target nuclear species of the MRI apparatus which are clinically spread, there is a hydrogen nucleus (proton) which is a main constituent matter of an object. By imaging information regarding a space distribution of a proton density or a space distribution of a relaxation time of an excitation state, forms or functions of a human head, abdomen, or limbs are imaged two-dimensionally or three-dimensionally.

Hereinafter, noise suppression control which is characteristics of the present invention and is performed by the measurement control unit 4 will be described in each example. Basically, a method of each of the examples to be described below or a combination of the methods of the examples can be applied as a specific method of changing the waveform of the gradient magnetic field pulse during repetition of the gradient magnetic field pulses at a constant period in order to perform the noise suppression control to shift the frequency of noise generated by the gradient magnetic field device to a low frequency side.

First Embodiment

Example 1 is an example in which the waveform of a gradient magnetic field pulse sequence of a setting repetition number is changed by reversing the polarity of at least one gradient magnetic field pulse during repetition of gradient magnetic field pulses at a constant period. (a) of FIG. 2A illustrates a slice selection gradient magnetic field pulse 201 which is used in a gradient echo system and is applied at a constant period. (b) of FIG. 2A illustrates a slice selection gradient magnetic field pulse 202 according to the example. The gradient magnetic field pulse 202 according to the example has a pulse sequence pattern in which its polarity is reversed once per three times of the repetition number of the gradient magnetic field pulse applied at the constant period and a waveform is changed, as illustrated in the drawing.

A graph 203 in (a) of FIG. 2B is a diagram of a frequency distribution obtained by performing Fourier conversion on the gradient magnetic field pulse 201 in (a) of FIG. 2A, reference numeral 204 denotes a frequency of a fundamental tone of noise, and reference numeral 205 denotes a frequency of a harmonic tone of the fundamental tone. A graph 206 in (b) of FIG. 2B is a diagram of a frequency distribution obtained by performing Fourier conversion on the gradient magnetic field pulse 202 in (b) of FIG. 2A. The horizontal axis represents a frequency and the vertical axis represents a value correlated to the strength of noise. In the drawing, reference numeral 207 denotes a frequency of a fundamental tone of noise and reference numeral 208 denotes a frequency of a harmonic tone of the fundamental tone.

As understood from these graphs, the polarity of the gradient magnetic field pulse 202 of a setting number m (where m is a natural number, m<n/2, and m=1 in the illustrated example) in a set setting repetition number n (where n is a natural number and n=3 in the illustrated example) of the gradient magnetic field pulse 202 applied at the constant period is reversed. In other words, the polarity of the gradient magnetic field pulse of the beginning of a pulse sequence formed by the gradient magnetic field pulses 202 of the setting repetition number of n is reversed with respect to another gradient magnetic field pulse. Accordingly, the gradient magnetic field pulse is applied at an interval of a long period and the frequency of the fundamental tone is shifted to a low frequency side, as illustrated in the drawing of the frequency distribution subjected to the Fourier conversion in (b) of FIG. 2B. This means that noise arriving from the gradient magnetic field device is shifted from a high frequency to a low frequency.

For example, when Ts is a repetition interval (period) of the gradient magnetic field pulse 201 in (a) of FIG. 2A, a sound in which the fundamental tone has a frequency of 1/Ts (Hz) is generated. On the ether hand, when the gradient magnetic field pulse 202 is reversed once per three times, as in (b) of FIG. 2A, the fundamental tone is changed to a sound with a frequency of 1/3Ts (Hz). At this time, the energy of the sound is distributed to frequencies and the levels of the sounds of the frequencies including the fundamental tone and the harmonic tone are lowered.

Figure 8:
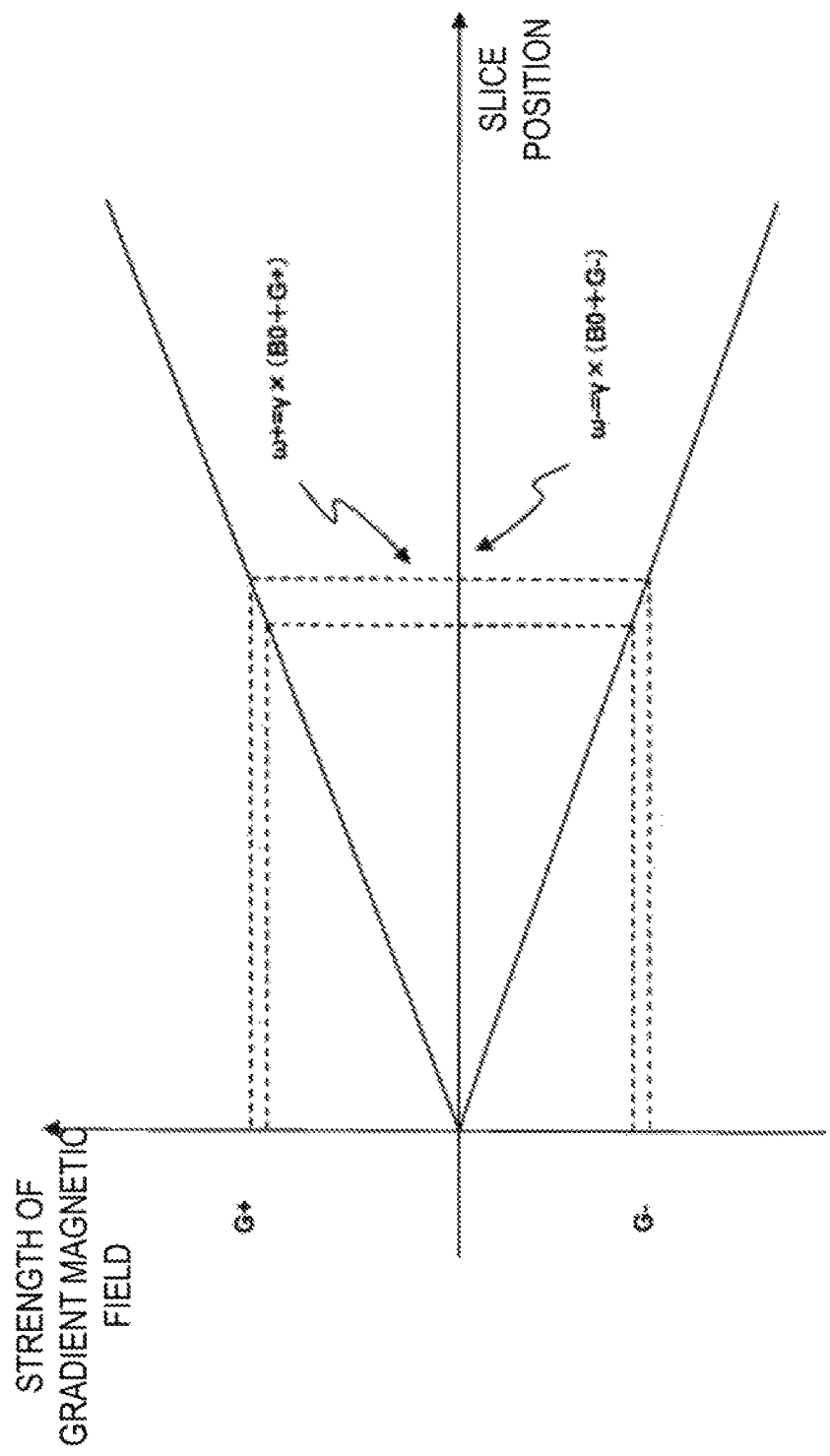
FIG. 8 is a diagram for describing a method of calculating an excitation frequency at the same slice position at the time of polarity reversion of a gradient magnetic field pulse.

Here, when the slice selection gradient magnetic field pulse is reversed, the excitation frequency of the RF pulse is calculated and changed so that a slice position is not changed compared to a slice position before the reversing. Specifically, in order to reverse the gradient magnetic field pulse and excite the same slice position, as illustrated in FIG. 8, the RF pulse with a excitation frequency (forward rotation time ω+, reversion time ω−) obtained from a static magnetic field strength B0, a gradient magnetic field strength (forward rotation time G+, reversion time G−), and Larmor frequency γ at that slice position is radiated.

In the examples of FIGS. 2A and 2B, an example of n=3 and m=1 is shown and an example is shown in which a pulse sequence in which the polarity of the gradient magnetic field pulse ct the beginning of the gradient magnetic field pulse with the setting repetition number of 3 is reversed is repeated according to the necessary number of slices. However, the gradient magnetic field pulse with the reversed polarity is not limited to the beginning, but the polarity of a gradient magnetic field pulse with any setting number m at any position is reversed and subjected to Fourier conversion and a frequency reduction effect is confirmed for adoption.

For example, when the frequency (1/Ts) of the fundamental tone is 1/n times, reversing of m times or less can also be performed for n-time repetitions. In a case that the fundamental tone of noise is a frequency equal to or less than 20 Hz with which there is no influence on human beings even when the noise suppression control is not performed, the noise suppression control may not be performed.

In Example 1, the waveform of the gradient magnetic field pulse is changed by reversing the polarity of at least one of the gradient magnetic field pulses during the repetition of the gradient magnetic field pulses at the constant period. Accordingly, according to the example, an application interval (period) of the plurality of gradient magnetic field pulses connected with the gradient magnetic field pulse with the reversed polarity can be lengthened. That is, by reversing the polarity of the gradient magnetic field pulse of, for example, the setting number m during the repetition of the setting repetition number n of the gradient magnetic field pulses with the constant period Ts, the gradient magnetic field device driven repeatedly with the gradient magnetic field pulses at the constant period Ts is driven by the pulse sequence with a period nTs of n times. As a result, the frequency of the fundamental tone of the noise of the gradient magnetic field device becomes 1/nTs, and thus the frequency can be lowered. In general, people feel uncomfortable as a frequency is higher. Therefore, by shifting the frequency of noise to a low frequency side, it is possible to reduce the sense of discomfort of people who are objects.

In the noise suppression control according to Example 1, various auxiliary functions can be appended. For example, a user interface (UI) 701 illustrated in FIG. 7 can be displayed on a screen of the operation unit 25 or the display 20 in FIG.

1. The UI 701 in FIG. 7 contains a noise suppression control flag 702, a noise frequency 703 before suppression, a noise frequency 704 after suppression, a parameter n705 of 1/nTs (Hz). Reference numeral 706 denotes a type of noise suppression control. Specifically, a type of example of the noise suppression control is displayed. A user can select to perform or not perform the noise suppression control using the UI 701 by turning on/off the noise suppression control flag 702.

The noise frequency 703 and the noise frequency 704 before suppression and after suppression may be displayed or such a frequency may be selected by the user. At this time, by displaying 1/Ts (Hz) calculated from the period Ts of the slice selection gradient magnetic field pulse and selecting the setting repetition number n705 which is a parameter, any period or frequency (1/nTs) may be selected.

In a case in which restriction in which the gradient magnetic field direction of each slice is made uniform is inserted, n corresponds to the number of slices in the case of slice selection of the setting repetition number n. Therefore, a frequency can be selected only from 1/Ts, 1/2Ts, . . . , and 1/(n−1)Ts, and 1/nTs (Hz), and thus it is desirable to put limitation to a number which is divisible by n at that time. As the type 706 of noise suppression control, a combination of examples related to the noise suppression control can also be selected.

Example 1 is not limited to the reversing between other slices, but can be applied between the same slices between a 90° RF pulse and a 180° RF pulse of a spin echo system or the same slices between 180° RF pulses of a first spin echo system.

The noise suppression control by the reversing of the polarity of the gradient magnetic field according to Example 1 is not limited to the slice selection gradient magnetic field pulse, but can also be applied to noise suppression of a frequency encoding gradient magnetic field pulse or a phase encoding gradient magnetic field pulse. In this case, disposition of a k space of magnetic resonance image data to be measured may be simultaneously reversed. The example can be applied to noise suppression of a crusher pulse applied for phase dispersion of transverse magnetization of protons selected and excited by an RF pulse.

Second Embodiment

Example 2 is an example in which the waveform of a gradient magnetic field pulse sequence of a setting repetition number is changed by increasing an application time (pulse width) of at least one gradient magnetic field pulse during repetition of gradient magnetic field pulses at a constant period. (a) of FIG. 3A illustrates a frequency encoding gradient magnetic field pulse 301 which is used in echo planar imaging or the like and is applied at a constant period. (b) of FIG. 3A illustrates a frequency encoding gradient magnetic field pulse 302 according to the example.

Figure 3B:
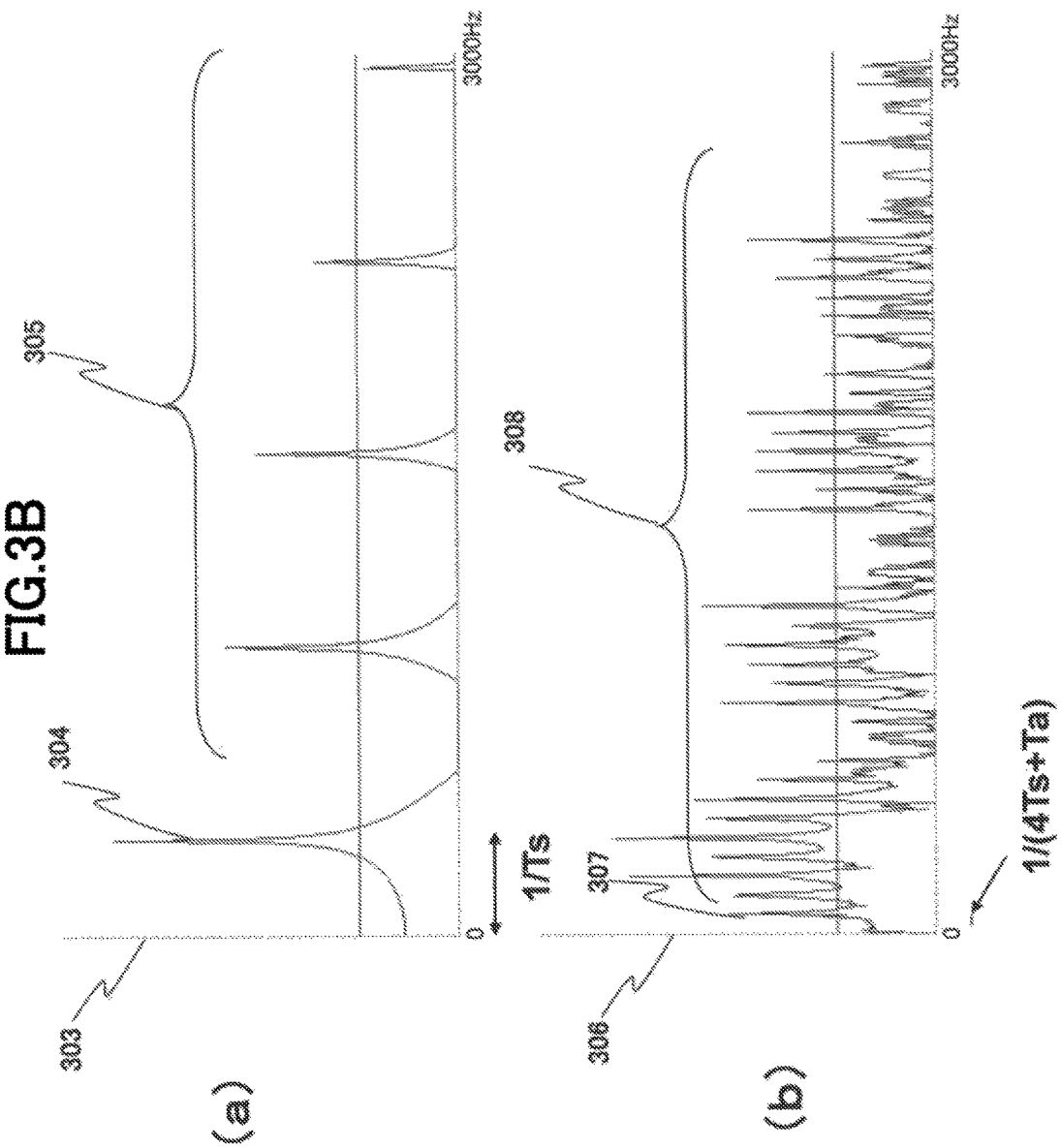
FIG. 3B is a diagram illustrating (a) a frequency distribution illustrated the gradient magnetic field pulse subjected to Fourier conversion in the related art in (a) of FIG. 3A and (b) a frequency distribution illustrated the gradient magnetic field pulse subjected to Fourier conversion according to Example 2 in (b) of FIG. 3A.

As illustrated in the drawing, the gradient magnetic field pulse 302 according to the example is set as a pulse sequence in which an application time (pulse width) of the gradient magnetic field pulses of the setting number m (where m=1 in the illustrated example) in the setting repetition number n (where n=4 in the illustrated example) is increased when vertical reversion of the frequency encoding gradient magnetic field pulse 302 applied at the constant period Ts is counted as the repetition number "1". A graph 303 in (a) of FIG. 3B is obtained by performing Fourier conversion on the gradient magnetic field pulse 301, reference numeral 304 denotes a frequency of a fundamental tone, and reference numeral 305 denotes a frequency of a harmonic tone. A graph 306 in (b) of FIG. 3B is a graph obtained by performing Fourier conversion on the gradient magnetic field pulse 302 in (b) of FIG. 3A. The horizontal axis represents a frequency and the vertical axis represents a value correlated to the strength of noise.

Reference numeral 307 denotes a frequency of a fundamental tone and reference numeral 308 denotes a frequency of a harmonic tone.

When an application time (pulse width) of the gradient magnetic field pulses applied at the constant period is increased, the gradient magnetic field is applied at an interval of a long period, and thus the sound generated thereby is shifted from a high frequency to a low frequency. That is, when Ts is an interval (period) of the vertical reversion of the gradient magnetic field in (a) of FIG. 3A, the application time of the gradient magnetic field pulses of the setting number m (where m=1 in the illustrated example) in the setting repetition number n (where n=4 in the illustrated example) is increased for a sound in which the fundamental tone having a frequency of a 1/Ts (Hz) is generated. Therefore, when Ta is an increased time, the fundamental tone is changed into a sound of a frequency of 1/(4Ts+Ta) (Hz). At this time, the energy of the sound is distributed to each frequency, and thus the level of the sound of each frequency including the fundamental tone and the harmonic tone is lowered.

In Example 2, the waveform of the gradient magnetic field pulse is changed by increasing the application time (pulse width) of at least one of the gradient magnetic field pulses during the repetition of the gradient magnetic field pulses at the constant period. Accordingly, according to Example 2, an application interval (period) of the plurality of gradient magnetic field pulses connected with the gradient magnetic field pulse with the increased pulse width can be lengthened.

That is, by increasing the application time of the plurality of gradient magnetic field pulse sequences applied at the constant period, the gradient magnetic field device driven repeatedly with the gradient magnetic field pulses at the constant period Ts is driven by the pulse sequence with a period (nTs+Ta). As a result, the frequency of the fundamental tone of the noise of the gradient magnetic field device becomes 1/(nTs+Ta), and thus the frequency can be lowered. Since the sound generated thereby is also shifted from a high frequency to a low frequency, it is possible to reduce the sense of discomfort of people who are objects, as in Example 1.

When the application time (pulse width) of the frequency encoding gradient magnetic field pulse is changed as in Example 2, it is regardless to say that an echo acquisition time TE is not changed in order to maintain the contrast of an image.

As in Example 1, various auxiliary functions such as the user interface (UI) 701 illustrated in FIG. 7 can be appended. As in Example 1, a target for which the application time of the gradient magnetic field is changed is not limited to the frequency encoding gradient magnetic field pulse, but may be a slice selection gradient magnetic field pulse or a phase encoding pulse. A crusher pulse applied for phase dispersion of transverse magnetization of protons selected and excited by an RF pulse may be used. Further, the example may be combined with Example 1, or a combination can be decided according to the shape of pulses to be used for each measurement.

Third Embodiment

Example 3 is an example in which the waveform of a gradient magnetic field pulse sequence of a setting repetition number is changed by moving an application timing of at least one gradient magnetic field pulse in a temporal axis direction during repetition of gradient magnetic field pulses at a constant period. In other words, the waveform of the pulse sequence of the gradient magnetic field pulses is changed by changing an application interval of the gradient magnetic field pulses. Accordingly, according to Example 3, the gradient magnetic field is applied at an interval of a long period and, thus the sound generated thereby is shifted from a high frequency to a low frequency.

That is, (a) of FIG. 4A illustrates a slice selection gradient magnetic field pulse 401 which is applied at a constant period. (b) of FIG. 4A illustrates a gradient magnetic field pulse 402 which has a pulse sequence pattern in which its waveform is changed by changing the application interval of the slice selection gradient magnetic field pulses applied at the constant period according to the example to the application interval of the gradient magnetic field of the setting number of 1 in the pulse sequence of the setting repetition number of 2. A graph 403 in (a) of FIG. 4B is a diagram of a frequency distribution obtained by performing Fourier conversion on the gradient magnetic field pulse 401 in (a) of FIG. 4A, reference numeral 404 denotes a frequency of a fundamental tone of noise, and reference numeral 405 denotes a frequency of a harmonic tone of the fundamental tone. A graph 406 in (b) of FIG. 4B is a diagram of a frequency distribution obtained by performing Fourier conversion on the gradient magnetic field pulse 402 in (b) of FIG. 4A. The horizontal axis represents a frequency and the vertical axis represents a value correlated to the strength of noise. In the drawing, reference numeral 407 denotes a frequency of a fundamental tone of noise and reference numeral 408 denotes a frequency of a harmonic tone of the fundamental tone.

When Ts is an interval (period) of the gradient magnetic field pulse 401 in (a) of FIG. 4A, a sound in which the fundamental tone has a frequency of 1/Ts (Hz) is generated. On the other hand, the application interval of the gradient magnetic field pulses of the setting number m (where m=1 in the illustrated example) in the setting repetition number n (where n=2 in the illustrated example) is changed by changing the waveform as in the gradient magnetic field pulse 402 illustrated in (b) of FIG. 4A. That is, the application interval of the first and second gradient magnetic field pulses of the gradient, magnetic field pulse sequence of the setting repetition number of 2 is shortened.

In other words, the interval with the first gradient magnetic field pulse is shortened by moving the application timing of the second gradient magnetic field pulse in the direction of the first gradient magnetic field pulse. Accordingly, the period of the gradient magnetic field pulse sequence of the setting repetition number n illustrated in (b) of FIG. 4A becomes nTs. As a result, as illustrated in (b) of FIG. 4B, the frequency of the fundamental tone of a sound generated from the gradient magnetic field device is changed into the frequency of 1/(2Ts) (Hz). Accordingly, as in Examples 1 and 2, it is possible to reduce the sense of discomfort of people who are objects. At this time, the energy of the sound is distributed to each frequency, and thus the level of the sound of each frequency including the fundamental tone and the harmonic tone is lowered.

As in Example 1, various auxiliary functions such as the user interface (UI) 701 illustrated in FIG. 7 can be appended. As in Example 1, a target for which the application time of the gradient magnetic field is changed is not limited to the slice selection gradient magnetic field pulse, but may be a frequency encoding gradient magnetic field pulse or a phase encoding pulse as long as a k space is correctly disposed. A crusher pulse applied for phase dispersion of transverse magnetization of protons selected and excited by an RF pulse may be used. Further, the example may be combined with other examples.

Fourth Embodiment

Example 4 of the present invention will be described. Example 4 is an example in which the waveform of a gradient magnetic field pulse sequence of a setting repetition number is changed by changing the strength of the gradient magnetic field pulses during repetition of gradient magnetic field pulses at a constant period. (a) of FIG. 5A illustrates a slice selection gradient magnetic field pulse 501 which is applied at a constant period. In (b) of FIG. 5A, an application strength of the crusher pulse of the gradient magnetic field pulse 501 illustrated in (a) of FIG. 5A is set to the setting repetition number n (where n=4 in the illustrated example), and a gradient magnetic field pulse 502 which is applied at the constant period by changing the strength of the crusher pulses of the setting number m (where m=4 in the illustrated example) is illustrated.

Figure 5B:
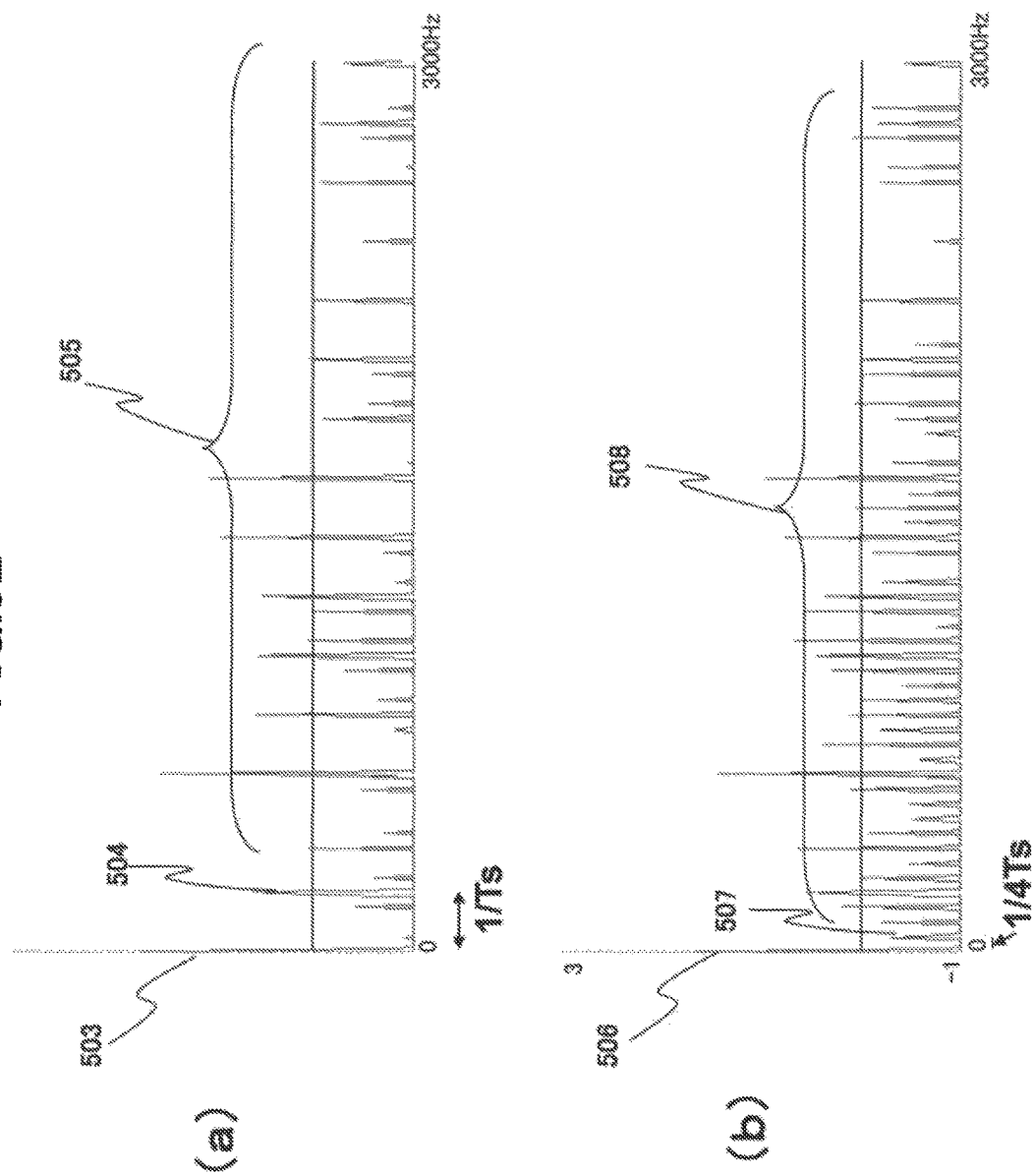
FIG. 5B is a diagram illustrating (a) a frequency distribution illustrated the gradient magnetic field pulse subjected to Fourier conversion in the related art in (a) of FIG. 5A and (b) a frequency distribution illustrated the gradient magnetic field pulse subjected to Fourier conversion according to Example 4 in (b) of FIG. 5A.

A graph 503 in (a) of FIG. 5B is a diagram of a frequency distribution obtained by performing Fourier conversion on the gradient magnetic field pulse 501 illustrated in (a) of FIG. 5A, reference numeral 504 denotes a frequency of a fundamental tone, and reference numeral 505 denotes a frequency of a harmonic tone. A graph 506 in (b) of FIG. 5B is a diagram of a frequency distribution obtained by performing Fourier conversion on the gradient magnetic field pulse 502 in (b) of FIG. 5A. The horizontal axis represents a frequency and the vertical axis represents a value correlated to the strength of noise. In the drawing, reference numeral 507 denotes a frequency of a fundamental tone and reference numeral 508 denotes a frequency of a harmonic tone. At this time, the energy of the sound is distributed to each frequency, and thus the level of the sound of each frequency including the fundamental tone and the harmonic tone is lowered.

According to Example 4, by changing the application strength of the crusher pulses of the gradient magnetic field pulses of the setting number m=4 of the gradient magnetic field pulses of the repetition number n=4 applied at the constant period and with the constant strength, the gradient magnetic field pulses are applied at an interval of a long period, and thus the high frequency of the arriving sound is also shifted to a low frequency. For example, when Ts is an interval (period) of the gradient magnetic field pulse in (a) of FIG. 5A, the application strength of the crusher pulses of the gradient magnetic field pulses is gradually changed, so that the generated sound in which the fundamental tone has a frequency of 1/Ts (Hz) is changed to a sound in which the fundamental tone has a frequency of 1/(4Ts) (Hz), as illustrated in (b) of FIG. 5B. Accordingly, it is possible to reduce the sense of discomfort of people who are objects, as in Examples 1 to 3. At this time, the energy of the sound is distributed to each frequency, and thus the level of the sound of each frequency including the fundamental tone and the harmonic tone is lowered.

As in Example 1, various auxiliary functions such as the user interface (UI) 701 illustrated in FIG. 7 can be appended. As in Example 1, a target for which the strength of the gradient magnetic field pulse is changed is not limited to the crusher pulse, and may be the slice selection gradient magnetic field pulse as long as the slice profile is the same. Even in the case of the phase encoding pulse, there may foe no change after the disposition of the k space is changed. The example may be combined with Example, 1, 2, or 3.

Fifth Embodiment

Example 5 of the present invention will be described with reference to FIG. 6. The example is an example in which noise is suppressed by preparing frequency characteristics of noise of the gradient magnetic field device generated due to the gradient magnetic field pulses in advance and changing a frequency more efficiently.

In (a) of FIG. 6, the horizontal axis represents a frequency and the vertical axis represents a noise level [dB(A)] of each strength of the gradient magnetic field pulse of the gradient magnetic field device. Reference numeral 601 denotes frequency characteristics of the noise level of the gradient magnetic field device. (b) of FIG. 6 is a graph of the level of a sound in which a fundamental tone has a frequency of 1/Ts when Ts is a period of the gradient magnetic field pulses and illustrates a noise level when the gradient magnetic field device has the frequency characteristics 601. (c) of FIG. 6 is a graph of the level of a sound in which a fundamental tone has a frequency of 1/2Ts when 2Ts is a period of the gradient magnetic field pulses and illustrates a noise level corresponding to the frequency characteristics 601 of the gradient magnetic field device. (d) of FIG. 6 is a graph of the level of a sound in which a fundamental tone has a frequency of 1/3Ts when 3Ts is a period of the gradient magnetic field pulses and illustrates a noise level when the gradient magnetic field device has the frequency characteristics 601.

The noise levels in regard to the frequency of the noise suppression in (b) to (d) of FIG. 6 are predicted in advance in correspondence to the frequency characteristics of the gradient magnetic field device in (a) of FIG. 6. In the example of FIG. 6, the graph in which the noise level is the smallest is (d) of FIG. 6. Thus, the setting repetition number n by which the period becomes 1/3Ts in the noise suppression control and the setting number m which changes the waveform can be automatically selected and changed. Further, a user can be informed a noise suppression effect, for example, noise [dB(A)] before and after the change.

According to the present invention, as described above, the frequency of the fundamental tone of the noise of the gradient magnetic field device can be shifted to a low frequency by applying a single or an appropriate combination of the noise suppression control of Examples 1 to 4. Further, when Example 5 is combined, the noise suppression control can be performed appropriately. At this time, the measurement control unit 4 may cause the user to select the combination of the noise suppression control described in the foregoing Examples 1 to 5.

Further, the measurement control unit 4 may change the waveform of the gradient magnetic field pulse in a case in which the constant period Ts of the gradient magnetic field pulse is shorter than a predetermined set period. The measurement control unit 4 may inform the user that one of the noise suppression control including the foregoing Examples 1 to 5 is performed.

In a case in which the waveform of the gradient magnetic field pulse is changed, it is regardless to say that control of a radiation frequency and a radiation phase of the high-frequency magnetic field pulse (RF pulse) are necessarily requested with the change in the waveform of the gradient magnetic field pulse.

The present invention is not limited to Examples 1 to 4 or a combination of the examples described above. It should be apparent to those skilled in the art that modifications or changes can be made within the known scope of the present invention, and the modifications or the changes, of course, pertain to the claims of the present specification.

That is, in the present invention, n (where n is a natural number) is the setting repetition number of gradient magnetic field pulses at the constant period Ts, the pulse sequence pattern of the gradient magnetic field pulse sequence of the setting repetition number n is changed to lengthen the pulse sequence pattern. A main object is to shift the frequency of the fundamental tone of noise generated from the gradient magnetic field device to a low frequency by repeatedly driving the gradient magnetic field device by the lengthened gradient magnetic field pulse sequence of the setting repetition number n. That is, the present invention is characterized in that the gradient magnetic field device is repeatedly driven in units of pulse sequence patterns with a low frequency.

In other words, when the pulse sequence pattern is changed, gradient magnetic field device driven repeatedly with the gradient magnetic field pulses at the constant period Ts is driven with the repetition period nTs in units of pulse sequence patterns. When Fourier conversion is performed on the pulse sequence pattern with the repetition period nTs, the frequency of the noise of the gradient magnetic field device becomes 1/nTs, and thus the low frequency is achieved.

REFERENCE SIGNS LIST

1 object
2 static magnetic field generation system
3 gradient magnetic field generation system
4 measurement control unit
5 transmission system
6 reception system
7 signal processing system
8 calculation processing unit
9 gradient magnetic field coil
10 gradient magnetic field power source
11 high-frequency oscillator
12 modulator
13 high-frequency amplifier
14a high-frequency coil (transmission coil)
14b high-frequency coil (reception coil)
15 signal amplifier
16 quadrature phase detector
17 A/D converter
18 magnetic disk
19 optical disc
21 ROM
22 RAM
23 track ball or mouse
24 keyboard

The invention claimed is:
1. A magnetic resonance imaging apparatus comprising:
a gradient magnetic field device that applies a pulse-shaped gradient magnetic field to an object placed in a static magnetic field; and
a measurement control unit that drives the gradient magnetic field device by one or more gradient magnetic field pulses and measures magnetic resonance image data,
wherein the measurement control unit performs noise suppression control to shift a frequency of noise generated by the gradient magnetic field device to a low frequency side by changing a waveform of at least one gradient magnetic field pulse during repetition of the gradient magnetic field pulses at a constant period, and wherein the measurement control unit performs, as the noise suppression control, a combination of two or more of:

a change in the waveform of the gradient magnetic field pulse for each setting repetition number of the gradient magnetic field pulses at the constant period, reversion of polarity of at least one gradient magnetic field pulse during the repetition of the gradient magnetic field pulses at the constant period, an increase in an application time of at least one gradient magnetic field pulse during the repetition of the gradient magnetic field pulses at the constant period, and movement of an application timing of at least one gradient magnetic field pulse in a temporal axis direction during the repetition of the gradient magnetic field pulses at the constant period.

2. The magnetic resonance imaging apparatus according to claim 1, wherein the measurement control unit performs the noise suppression control by changing strength of the gradient magnetic field pulse during the repetition of the gradient magnetic field pulses at the constant period.

3. The magnetic resonance imaging apparatus according to claim 2, wherein the measurement control unit performs the noise suppression control by gradually changing strength of a crusher pulse applied to the gradient magnetic field pulses.

4. The magnetic resonance imaging apparatus according to claim 1, wherein the measurement control unit changes the waveform of the gradient magnetic field pulse in a case in which the constant period of the gradient magnetic field pulses is shorter than a set period.

5. The magnetic resonance imaging apparatus according to claim 1, wherein the measurement control unit informs a user that the noise suppression control is performed.

6. The magnetic resonance imaging apparatus according to claim 1, wherein the measurement control unit causes a user to select the frequency of the noise by the noise suppression control.

7. The magnetic resonance imaging apparatus according to claim 1, wherein the measurement control unit causes a user to select the combination as the noise suppression control.

8. The magnetic resonance imaging apparatus according to claim 1, wherein the measurement control unit selects a setting repetition number of repetition of the gradient magnetic field pulses for which a fundamental tone of noise is smallest based on characteristics of the noise of the gradient magnetic field device.

9. A noise reduction method in a magnetic resonance imaging apparatus including a gradient magnetic field device that applies a pulse-shaped gradient magnetic field to an object placed in a static magnetic field and a measurement control unit that drives the gradient magnetic field device by one or more gradient magnetic field pulses and measures magnetic resonance image data, the method comprising:

(a) performing noise suppression control to shift a frequency of noise generated by the gradient magnetic field device to a low frequency side by changing a waveform of at least one gradient magnetic field pulse during repetition of the gradient magnetic field pulses at a constant period;

performing, as the noise suppression control in (a), a combination of two or more of (i) through (iv):

(i) changing the waveform of the gradient magnetic field pulse for each setting repetition number of the gradient magnetic field pulses at the constant period;

(ii) reversing polarity of at least one gradient magnetic field pulse during the repetition of the gradient magnetic field pulses at the constant period;

(iii) increasing an application time of at least one gradient magnetic field pulse during the repetition of the gradient magnetic field pulses at the constant period;

(iv) moving an application timing of at least one gradient magnetic field pulse in a temporal axis direction during the repetition of the gradient magnetic field pulses at the constant period; and measuring the magnetic resonance image data from the object using the gradient magnetic field pulse with the changed waveform.

* * * * *